United States Patent
Ha et al.

(10) Patent No.: US 7,304,906 B2
(45) Date of Patent: Dec. 4, 2007

(54) METHOD OF CONTROLLING MODE REGISTER SET OPERATION IN MEMORY DEVICE AND CIRCUIT THEREOF

(75) Inventors: Sung Joo Ha, Seoul (KR); Tae Yun Kim, Chungcheongbuk-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 100 days.

(21) Appl. No.: 11/190,222

(22) Filed: Jul. 26, 2005

(65) Prior Publication Data

US 2006/0133188 A1   Jun. 22, 2006

(30) Foreign Application Priority Data

Dec. 20, 2004   (KR) ...................... 10-2004-0108686

(51) Int. Cl.
*G11C 7/00* (2006.01)
(52) U.S. Cl. ................. 365/222; 365/233; 365/230.08; 365/240
(58) Field of Classification Search ................ 365/222, 365/233, 201, 226, 230.08, 240
See application file for complete search history.

(56) References Cited

U.S. PATENT DOCUMENTS

| | | | |
|---|---|---|---|
| 6,215,714 B1 * | 4/2001 | Takemae et al. ............ 365/222 |
| 6,272,066 B1 * | 8/2001 | Ooishi ........................ 365/233 |
| 6,288,957 B1 * | 9/2001 | Katoh et al. ................. 365/201 |
| 6,381,188 B1 * | 4/2002 | Choi et al. ................... 365/222 |
| 6,414,890 B2 * | 7/2002 | Arimoto et al. ............ 365/201 |
| 6,459,636 B2 * | 10/2002 | Lee et al. ................... 365/201 |
| 6,667,905 B2 * | 12/2003 | Dono et al. ............ 365/185.08 |
| 7,042,800 B2 * | 5/2006 | Kang et al. ................. 365/233 |

FOREIGN PATENT DOCUMENTS

KR   1999 003104   1/1999

* cited by examiner

*Primary Examiner*—David Lam
(74) *Attorney, Agent, or Firm*—Ladas & Parry LLP

(57) ABSTRACT

Disclosed is a method of controlling an MRS operation in a memory device which can prevent an unnecessary MRS operation due to a malfunction of the memory device at a time when the memory device exits from a self-refresh mode. According to this method, external addresses are used to intercept a mode register set command signal that enables the MRS operation at a time point at which the memory device exits from the self-refresh mode.

8 Claims, 4 Drawing Sheets

METHOD OF CONTROLLING MODE REGISTER SET OPERATION IN MEMORY DEVICE AND CIRCUIT THEREOF

BACKGROUND OF THE INVENTION

1. Field of the Invention

The present invention relates to a method of controlling a mode register set (MRS) operation in a memory device, and more particularly to a method and circuit for controlling an MRS operation in a memory device which can prevent an unnecessary MRS operation due to a malfunction of the memory device at a time when the memory device exits from a self-refresh mode.

2. Description of the Prior Art

Generally, a memory device is accessed in an operation mode, for example, in a state that a column address strobe (CAS) latency, a burst length, etc., are preset by a memory controller. Mode registers provide places in which set operation modes of the memory device are stored, and a series of such mode registers is called a mode register set (MRS).

FIG. 1 is a block diagram illustrating the construction of a conventional MRS control circuit.

The conventional MRS control circuit is briefly provided with an input driver 100, a first decoding means 110, a second decoding means 120 and an output driver 130.

The input driver 100 receives a mode register set command signal mrgsetup, a test mode decision address A<7> and an EMRS (Extended Mode Register Set) mode decision address BA<0>. Here, the mode register set command signal mrgsetup is a pulse signal that is enabled in a condition that signals of /CS (Chip Select), /RAS (Row Address Strobe), /CAS and /WE (Write Enable) inputted to a command decoder (not illustrated) are all in a 'logic low' state. The test mode decision address A<7> is an external address inputted to the 7$^{th}$ address pin of the memory device. Meanwhile, the EMRS mode decision address BA<0> refers to a signal for setting additional operation modes in addition to general operation modes of the memory device such as the CAS latency, burst length, etc., and particularly an EMRS operation entry signal for setting a DLL enable state, drive strength, etc.

The first decoding means 110 combines output signals of the input driver 100, and finally disables the mode register set command signal mrgsetup even in a test mode in that the test mode decision address A<7> is enabled as a 'logic high' state. Additionally, if the EMRS mode selection address BA<0> is enabled as a logic high state, the first decoding means 110 disables the mode register set command signal mrgsetup in the same manner as the test mode. The second decoding means 120 combines an output signal of the first decoding means 110 and a power-up signal pwrup, and if the power-up signal pwrup is enabled as a logic high state, it transfers the output signal of the first decoding means 110 to the output buffer 130. The output buffer 130 that has received the output signal of the first decoding means 110 finally outputs an address latency signal mrg_latp). Here, the power-up signal pwrup is an operation start signal that is enabled at a high level if the operation power of the memory device rises over a predetermined level.

If all the signals of /CS, /RAS, /CAS and /WE inputted to the command decoder satisfy the 'logic low' condition during the initial operation of the memory device, the mode register set command signal mrgsetup is enabled as a logic high state. The enabled mode register set command signal mrgsetup finally enables the address latency signal mrg_latp as a logic high state after passing through the first and second decoding means 400 and 500 together with the test mode decision address A<7> and the power-up signal pwrup.

If the address latency signal mrg_latp is enabled, the external address for setting the mode of the memory device is called from an address buffer (not illustrated), and the CAS latency, burst type, burst length, etc., of the memory device are decided during an enabled period of the mode register set command signal mrgsetup. In relation to this, an example of a mode selection table of the memory device according to the external address is illustrated in FIG. 2.

However, the conventional memory device may perform an unintended MRS operation as the mode register set command signal mrgsetup is enabled due to an internal noise component when the memory device exits from the self-refresh mode. Specifically, if the memory device exits from the self-refresh mode, all signals except for the internal power VDD return to their own potential levels from a ground level VSS. At this time, a command decoder (not illustrated) may be enabled due to a glitch because the noise component is in a state in which all the signals including the signals of /CS, /RAS, /CAS and /WE are still in a logic low state, In this case, since the signals including the signals of /CS, /RAS, /CAS and /WE inputted to the command decoder are all in the logic low state, the mode register set command signal mrgsetup inputted to the MRS control circuit is enabled to change the mode of the memory device. As described above, the MRS operation which may occur when the memory device exits from the self-refresh mode causes a malfunction of the memory device to deteriorate the performance and reliability of the memory device.

SUMMARY OF THE INVENTION

Accordingly, the present invention has been made to solve the above-mentioned problems occurring in the prior art, and it is an object of the present invention to provide a method and circuit for controlling an MRS operation in a memory device which can prevent an unnecessary MRS operation due to a malfunction of the memory device at a time when the memory device exits from a self-refresh mode.

In a first embodiment of the present invention, there is provided a method of controlling a mode register set (MRS) operation in a memory device when the memory device exits from a self-refresh mode, which comprises the step of intercepting a mode register set command signal that enables the MRS operation using an external address after recognizing a time point at which the memory device exits from the self-refresh mode.

The external address is applied through an address pin for deciding a burst length and a column address strobe (CAS) latency.

The external address being applied to the address pin is in a logic low state.

The mode register set command signal is enabled when signals of /CS (Chip Select), /RAS (Row Address Strobe), /CAS and /WE (Write Enable) are all in a logic low state.

The signals of /CS, /RAS, /CAS and /WE are all in a logic low state at the time when the memory device exits from the self-refresh mode.

In a second embodiment of the present invention, there is provided a circuit of controlling a mode register set (MRS) operation in a memory device that receives an MRS-related control signal and outputting a mode register set command signal for enabling the MRS operation, which comprises an intercepting unit for receiving an external address and intercepting the mode register set command signal.

The intercepting unit comprises a control means for receiving the external address and a switching means for being enabled by an output signal of the control means.

If the switching means is enabled, the mode register set command signal is intercepted.

When the external address inputted to the control means is in a logic low state, the switching means is enabled.

The external address is applied through an address pin for deciding a burst length and a column address strobe (CAS) latency.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
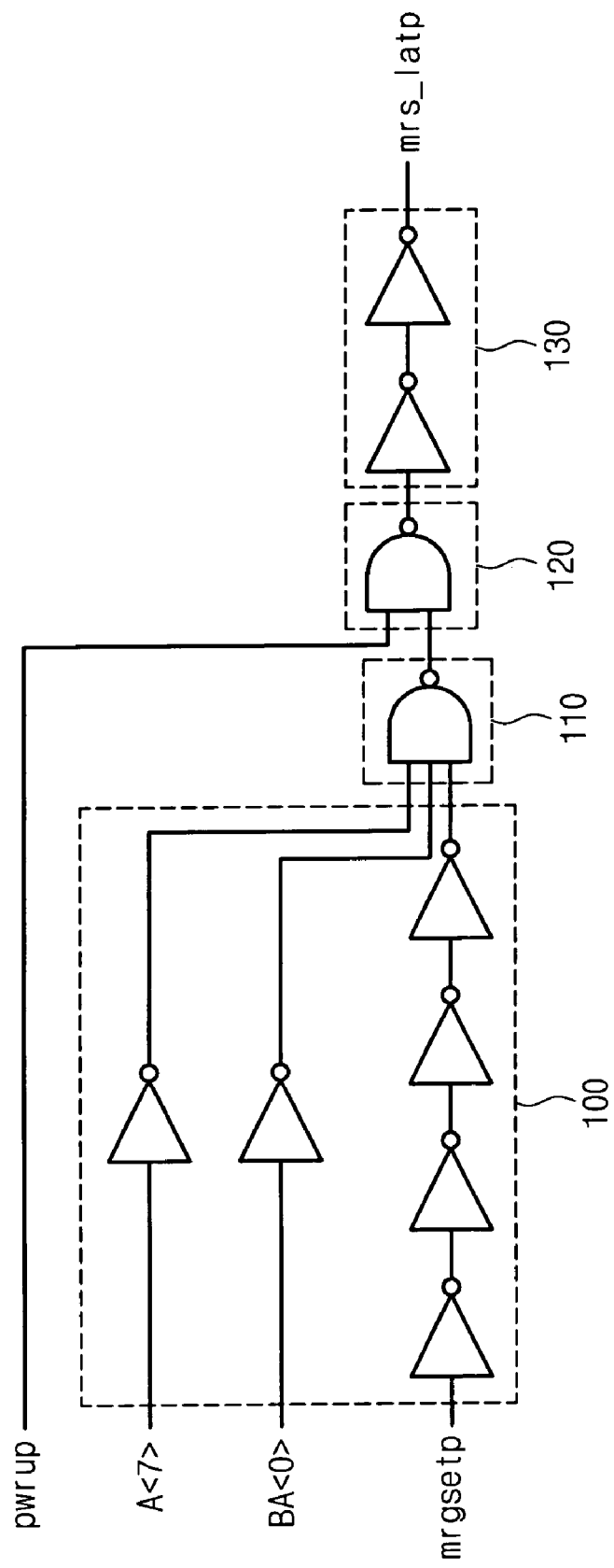
FIG. 1 is a block diagram illustrating the construction of a conventional MRS control circuit.

Hereinafter, preferred embodiments of the present invention will be described with reference to the accompanying drawings. In the following description and drawings, the same reference numerals are used to designate the same or similar components, and so repetition of the description on the same or similar components will be omitted.

Figure 3:
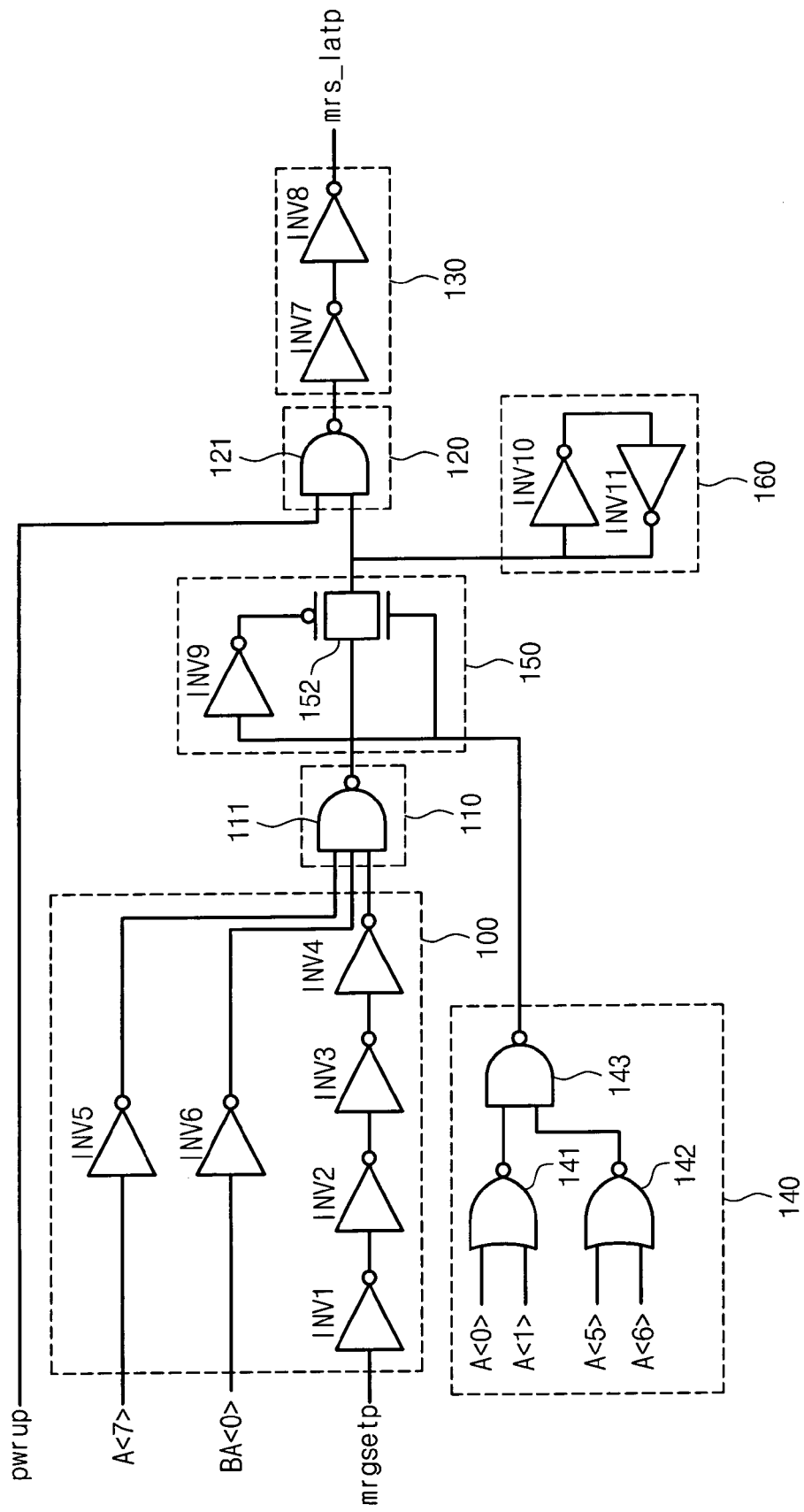
FIG. 3 is a view illustrating an MRS control circuit according to an embodiment of the present invention.

FIG. 3 is a view illustrating an MRS control circuit according to an embodiment of the present invention.

Referring to FIG. 3, the MRS control circuit according to an embodiment of the present invention is provided with an input driver 100, a first decoding means 110, a second decoding means 120, an output driver 130, a control means 140, a switching means 150 and a latch means 160.

The input driver 100 is provided with inverters INV1, INV2, INV3 and INV4, connected in series, for receiving a mode register set command signal mrgsetup, an inverter INV5 for receiving and inverting a test mode decision address A<7> to output an inverted test mode decision address, and an inverter INV6 for receiving and inverting an extended MRS (EMRS) mode decision address BA<0> to output an inverted EMRS mode decision address.

The first decoding means 110 is provided with a first NAND gate 111 for NAND-gating the inverted test mode decision address A<7>, the inverted EMRS mode decision address BA<0> and the mode register set command signal mrgsetup outputted from the input driver 100 to output the NAND-gated signals to the switching means 150.

The second decoding means 120 is provided with a second NAND gate 121 for NAND-gating the output signal of the first decoding means 130 transferred from the switching means 150 and a power-up signal pwrup that is one of control signals of the memory device to output the NAND-gated signals.

The output driver 130 is provided with inverters INV7 and INV8, connected in series, for receiving the output signal of the second decoding means 120 and outputting an address latency signal mrs_latp.

The control means 140 is provided with a first NOR gate 141 for receiving and NOR-gating external addresses A<0> and A<1>, a second NOR gate 142 for receiving and NOR-gating external addresses A<5> and A<6>, and a third NAND gate 143 for receiving and NAND-gating output signals of the first NOR gate 141 and the second NOR gate 142 to output the NAND-gated signals to the switching means 150. Consequently, the control means 140 OR-gates the input external addresses A<0>, A<1>, A<5> and A<6>. Here, the external addresses A<0>, A<1>, A<5> and A<6> are address signals inputted through external address pins of the memory device.

The switching means 150 is provided with a transmission gate 151 for transferring the output signal of the first decoding means 110 to the second decoding means 120, and an inverter INV9 for receiving and inverting the output signal of the control means 140 to apply the inverted signal to the transmission gate 151.

The latch means 160 is provided with two inverters INV10 and INV11, complementarily connected to the output terminal of the switching means 150, for preventing a final output terminal of the circuit according to the present invention from being in a floating state.

Hereinafter, the operation of the present invention as constructed above will be explained in detail with reference to the accompanying drawings.

The operation of the MRS control circuit according to the present invention is briefly divided into a normal MRS operation of the memory device and an operation in the case in which the memory device exits from the self-refresh mode.

First, the normal MRS operation of the memory device will be explained. If the signals of /CS, /RAS, /CAS and /WE inputted to a command decoder (not illustrated) are all in a logic low state, the mode register set command signal mrgsetup is enabled as a logic high state. Here, if the memory device is not in a test mode and it does not perform an EMRS operation, the test mode decision address A<7> and the EMRS mode decision address BA<0> are disabled as a logic low state.

As described above, the enabled mode register set command signal mrgsetup and the disabled test mode decision address A<7> and EMRS mode decision address BA<0> are inputted to the first decoding means 110 through the input driver 100, and the output signal of the first NAND gate 111 is transferred to the switching means 150 as a logic low signal.

The switching means 150 operates by the output signal of the control means 140, and if the output signal of the control means 140 is in a logic high state, it transfers the output signal of the first decoding means 110 to the second decoding means 120 by turning on the transmission gate 151 provided therein. Here, the control means 140 always provides an output signal of a logic high state except for a case that values of the input external addresses A<0>, A<1>, A<5> and A<6> are all in a logic low state.

Thereafter, the enabled power-up signal pwrup and the output signal of the first decoding means 110 transferred through the switching means 150 are transferred to the second decoding means 120, and an output signal of a logic high state is produced from the second NAND gate 121.

Consequently, the output signal of the second decoding means 120 is inputted to the output driver 130, and then the address latency signal mrs_latp enabled as a logic high state is outputted from the output driver 130. At this time, the enabled address latency signal mrs_latp calls the external address for the MRS operation of the memory device from an address buffer (not illustrated), and decides the CAS latency, burst type, burst length, etc., of the memory device during the enabled period of the mode register set command signal mrgsetup.

Next, the operation of the MRS control circuit according to the present invention when the memory device exits from the self-refresh mode will be explained.

At the time when the memory device exits from the self-refresh mode, all the signals including the external addresses, /CS, /RAS, /CAS and /WE are in a logic low state. In this case, if the command decoder (not illustrated) is abnormally enabled due to the glitch caused by the internal noise component, it senses the logic low state of all the signals including /CS, /RAS, /CAS and /WE, and enables the mode register set command signal mrgsetup. The enabled mode register set command signal mrgsetup is transferred to the switching means 150 through the first decoding means 110 as the logic low state except for the case that the memory device is in the test mode, i.e., the test mode decision address A<7> is in a logic low state.

Simultaneously, the control means 140 receives the external addresses A<0>, A<1>, A<5> and A<6> of a logic low state and provides an output signal of a logic low state. The switching means 150 that has received this signal intercepts the output signal of the first decoding means 110 by turning off the transmission gate 151. Accordingly, the address latency signal mrs_latp is kept in a disabled (i.e., logic low) state, and thus the previously set mode register set value of the memory device is maintained.

Meanwhile, if the memory device operates in the test mode, the test mode decision address A<7> of a logic high state is inputted to the input driver 100, and the output signal of the first NAND gate 111 that has received the inverted test mode decision address is in a logic high state. Accordingly, the address latency signal mrs_latp is disabled as a logic low state.

Additionally, if the memory device operates in the EMRS mode, the EMRS mode decision address BA<0> of a logic high state is inputted to the input driver 100, and the output signal of the first NAND gate 111 that has received the inverted EMRS mode decision address makes the address latency signal mrs_latp be disabled as a logic low state to intercept the MRS operation.

Figure 4:
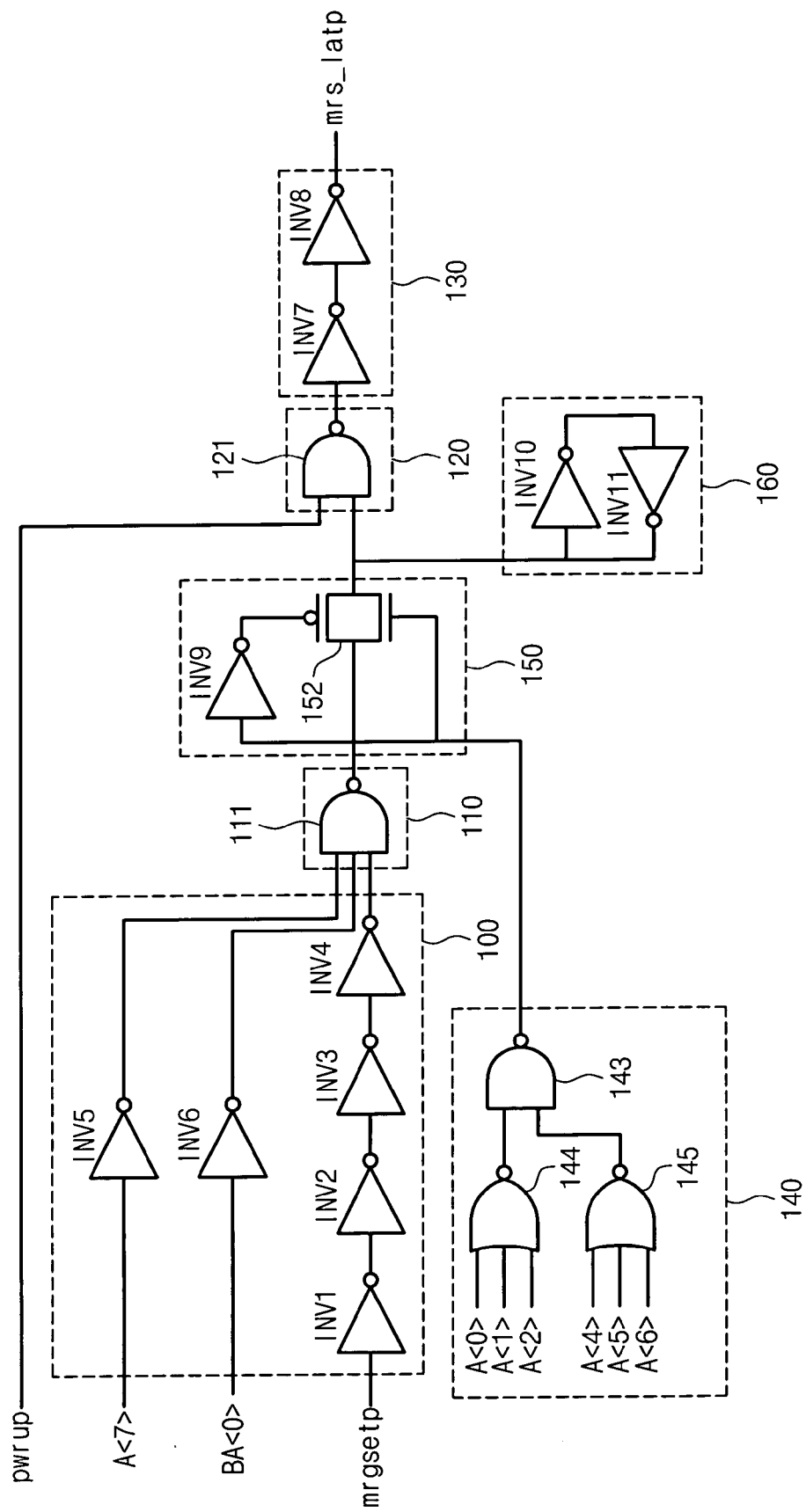
FIG. 4 is a view illustrating an MRS control circuit according to another embodiment of the present invention.

FIG. 4 is a view illustrating an MRS control circuit according to another embodiment of the present invention.

Figure 2:
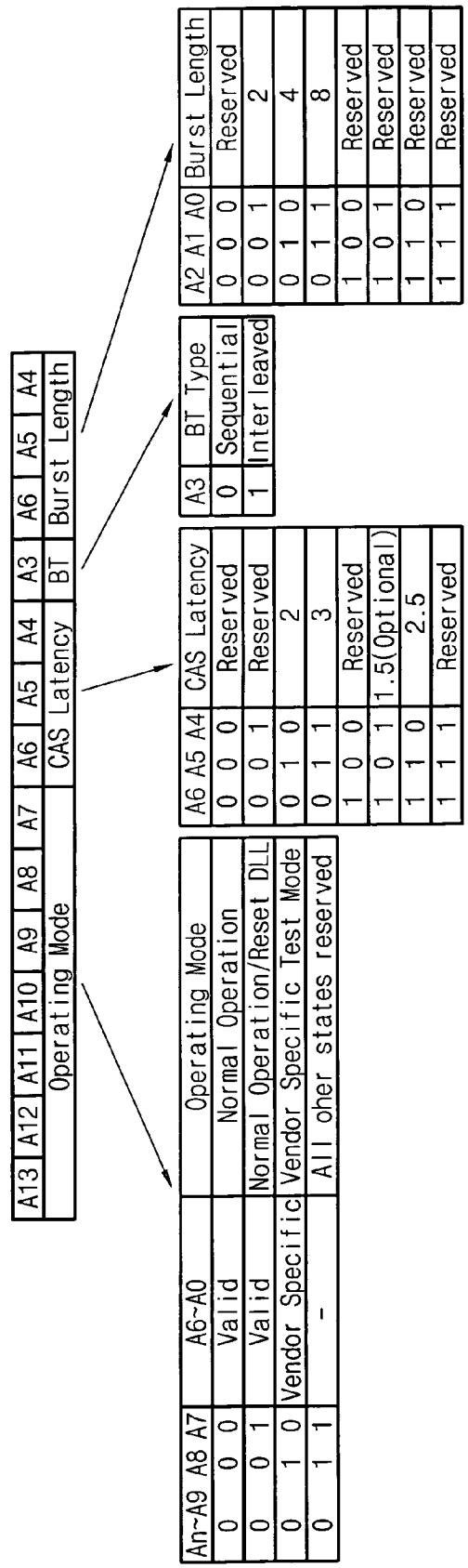
FIG. 2 is a view illustrating an example of a mode selection table of a memory device according to an external address.

Referring to FIG. 4, the MRS control circuit according to another embodiment of the present invention is provided with an input driver 100, a first decoding means 110, a second decoding means 120, an output driver 130, a control means 140, a switching means 150 and a latch means 160. That is, the MRS control circuit according to another embodiment of the present invention has the construction and operation similar to the MRS control circuit according to the embodiment of the present invention as illustrated in FIG. 3. However, in constructing the control means 140, the number of bits of external addresses A<0>, A<1>, A<3>, A<4>, A<5> and A<6> respectively inputted to third and fourth NOR gates 144 and 145 is increased from two bits to three bits. The increase of the number of bits as above is for more accurately preventing an error of the MRS operation in using reserved codes in consideration of the number of bits of lower addresses among external addresses for deciding the CAS latency, burst type and burst length (Referring to FIG. 2, reserved codes are all in a logic low state).

Hereinafter, the difference between the conventional MRS control circuit and the MRS control circuit according to the present invention and the relative superiority of the MRS control circuit according to the present invention will be explained.

First, the conventional MRS control circuit as illustrated in FIG. 1 has no means for preventing the MRS operation due to the malfunction of the command decoder when the memory device exits from the self-refresh mode. However, the MRS control circuit according to the present invention as illustrated in FIG. 3 includes the control means 140 and the switching means 150.

Due to this difference, the MRS control circuit according to the present invention can intercept the mode register set command signal mrgsetup that is enabled due to a glitch or other unexpected causes at the time when the memory device exits from the self-refresh mode, and thus it can prevent the mode of the memory device from being changed to a standby state in which the CAS latency, burst type and burst length are not in use when the memory device exits from the self-refresh mode.

As described above, according to the present invention, the unnecessary MRS operation due to the malfunction at the time when the memory device exits from the self-refresh mode can be prevented, so that deterioration of the performance and reliability of the memory device can be prevented.

Although preferred embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. A method of controlling a mode register set (MRS) operation in a memory device when the memory device exits from a self-refresh mode, the method comprising the step of:
    intercepting a mode register set command signal that enables the MRS operation using an external address applied to an address decoding circuit through a plurality of address pins for deciding a burst length and a column address strobe (CAS) latency, said mode register set command signal enabling the MRS operation, after the memory device exits a self-refresh mode; and
    simultaneously with the interception of the mode register set command signal, receiving a plurality of address signals of the memory device and disabling the transmission of the mode register set command signal to a memory device through a transmission gate, when the plurality of address signals are logic zero.

2. The method as claimed in claim 1, wherein the external address applied to the address pins is in a logic low state.

3. The method as claimed in claim 1, wherein the mode register set command signal is enabled when signals of /CS (Chip Select), /RAS (Row Address Strobe), /CAS (Column Address Strobe) and /WE (Write Enable) are all in a logic low state.

4. The method as claimed in claim 1, wherein the signals of /CS, /RAS, /CAS and /WE are all in a logic low state at the time when the memory device exits from the self-refresh mode.

5. A circuit for controlling a mode register set (MRS) operation in a memory device that receives an MRS-related control signal and outputting a mode register set command signal for enabling the MRS operation, the circuit comprising:

an input driver circuit that receives an external address, a mode decision address and the mode register set command signal the, the input driver circuit having an output, coupled to an input of a switching circuit, the switching circuit having an output and having a control input, the signal input to the control input of the switching circuit selectably enabling and disabling transmission of the signal output from the input driver circuit to a memory device from the switching circuit output; and a control circuit that receives a plurality of address signals from a plurality of address lines, the control circuit having an output coupled to the control input of the switching circuit such that the switching circuit will block transmission of the mode register set command signal from the input driver circuit when the plurality of address lines input to said control circuit are logic zero.

6. The circuit as claimed in claim 5, wherein if the switching circuit is enabled, the mode register set command signal is intercepted.

7. The circuit as claimed in claim 5, wherein when the address lines input to the control circuit are at a logic zero state, the switching circuit is enabled.

8. The circuit as claimed in claim 5, wherein the external address is applied through a plurality of address pins for deciding a burst length and a column address strobe (CAS) latency.

* * * * *